(12) United States Patent
Wright et al.

(10) Patent No.: US 8,981,858 B1
(45) Date of Patent: Mar. 17, 2015

(54) SPREAD SPECTRUM OSCILLATOR

(75) Inventors: David G Wright, San Diego, CA (US); Timothy Williams, Bellevue, WA (US); Edward L. Grivna, Brooklyn Park, MN (US); Mohandas Palatholmana Sivadasan, Bangalore (IN)

(73) Assignee: Cypress Semiconductor Corporation, San Jose, CA (US)

( * ) Notice: Subject to any disclaimer, the term of this patent is extended or adjusted under 35 U.S.C. 154(b) by 73 days.

(21) Appl. No.: 13/341,847

(22) Filed: Dec. 30, 2011

(51) Int. Cl.
| H03B 23/00 | (2006.01) |
| H04B 15/04 | (2006.01) |
| H03K 3/0231 | (2006.01) |
| H03K 4/501 | (2006.01) |
| H03C 3/00 | (2006.01) |

(52) U.S. Cl.
CPC ............... *H03B 23/00* (2013.01); *H03C 3/00* (2013.01); *H03K 3/0231* (2013.01); *H03K 4/501* (2013.01); *H04B 15/04* (2013.01); *H04B 2215/067* (2013.01)
USPC .............. 331/78; 331/111; 331/143; 331/178

(58) Field of Classification Search
CPC ...... H03B 23/00; H03B 29/00; H03K 3/0231; H03K 3/354; H03K 4/08; H03K 4/50; H03K 4/501; H03K 4/502; H03K 7/06; H03C 3/00
USPC .................... 331/78, 178, 111, 143
See application file for complete search history.

(56) References Cited

U.S. PATENT DOCUMENTS

| 4,282,595 A | 8/1981 | Lowdenslager et al. |
| 5,012,437 A | 4/1991 | Recker et al. |
| 6,014,063 A | 1/2000 | Liu et al. |
| 6,084,483 A | 7/2000 | Keshtbod |
| 6,590,458 B2 | 7/2003 | Rombach et al. |
| 6,980,039 B1* | 12/2005 | Dening et al. ............... 327/164 |
| 7,015,764 B2 | 3/2006 | Starr et al. |
| 7,336,134 B1 | 2/2008 | Janesch et al. |
| 7,434,083 B1* | 10/2008 | Wilson ........................ 713/600 |
| 7,504,897 B2* | 3/2009 | Chava et al. .................... 331/78 |
| 7,934,039 B2 | 4/2011 | Fredriksson et al. |
| 2004/0009027 A1 | 1/2004 | Gadberry |
| 2008/0025379 A1* | 1/2008 | Hayem et al. ................ 375/216 |
| 2008/0100350 A1* | 5/2008 | Pernia et al. .................. 327/114 |
| 2009/0008568 A1 | 1/2009 | Abe |
| 2010/0188129 A1* | 7/2010 | Ma ................................ 327/294 |

OTHER PUBLICATIONS

Joe Levi, "What Can You Do With a Barometer on a Smartphone?" Oct. 19, 2011, http://pocketnow.com/android/what-can-you-do-with-a-barometer-on-a-smartphone.

* cited by examiner

*Primary Examiner* — Ryan Johnson

(57) ABSTRACT

An apparatus includes a selection device to select a spreading profile from a plurality of spreading profiles, and an oscillation device to generate clock signals having different frequencies over time based on the selected spreading profile. A method includes selecting a spreading profile from a plurality of spreading profiles, and generating clock signals having different frequencies over time based on the selected spreading profile.

20 Claims, 7 Drawing Sheets

SPREAD SPECTRUM OSCILLATOR

TECHNICAL FIELD

This disclosure relates generally to electronic systems, and, more particularly, to spread spectrum oscillation.

BACKGROUND

Many systems include an internal clock generator to generate a clock signal for various electronic devices in the system. The internal clock generator can include a fixed-frequency oscillator to generate the clock signal with a specific frequency. While clock signals with a specific frequency can drive and/or provide timing for the various electronic devices in the system, a device or a system including the fixed-frequency oscillator can emit radio frequency (RF) signals of sufficient magnitude that can cause electromagnetic interference (EMI) with the surrounding electronic devices operating near the specific frequency or its harmonics. Similarly, incoming EMI from other electronic devices can alter the functionality of the internal clock generator, for example, the ability of the fixed-frequency oscillator to generate the clock signal.

DETAILED DESCRIPTION

An apparatus can include a selection device to select a spreading profile from a plurality of spreading profiles, and an oscillation device to generate clock signals having different frequencies over time based on the spreading profile. The variation of the clock signal frequency can help reduce emissions by the device or product operated by the spread spectrum oscillator, which can cause electromagnetic interference (EMI) with the surrounding devices in the electronic system. Embodiments are shown and described below in greater detail.

Figure 1:
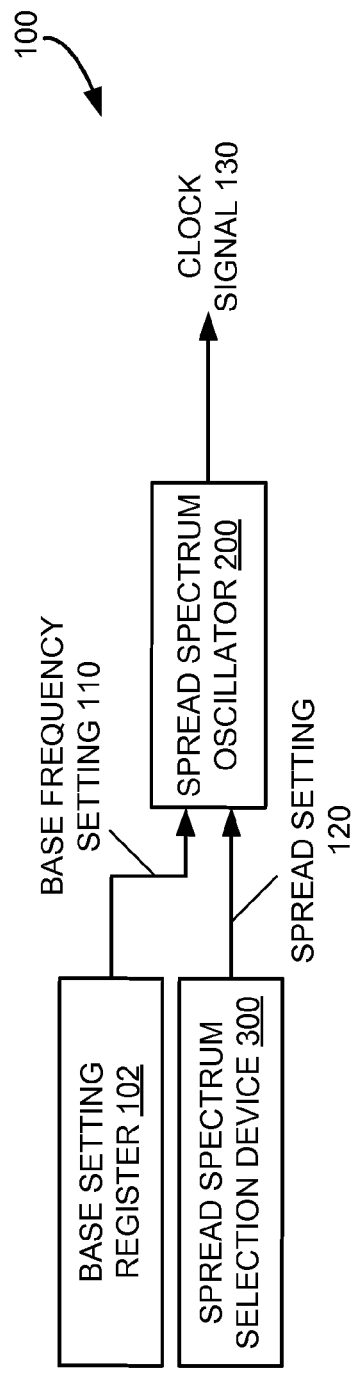
FIG. 1 is block diagram example of system including a spread spectrum oscillator.

FIG. 1 is block diagram example of system 100 including a spread spectrum oscillator 200. Referring to FIG. 1, the spread spectrum oscillator 200 can generate a clock signal 130 having a frequency, for example, based on a base frequency setting 110 and a spread setting 120. Changes to one or more of the base frequency setting 110 or the spread setting 120 can cause the spread spectrum oscillator 200 to vary the frequency of the clock signal 130. In some embodiments, the spread setting 120 can correspond to an offset value of the base frequency setting 110.

The system 100 can include a base setting register 102 to store the base frequency setting 110 and a spread spectrum selection device 300 to store multiple spreading profiles, each of which include multiple spread settings. The base setting register 102 can provide the base frequency setting 110 to the spread spectrum oscillator 200. The spread spectrum selection device 300 can select at least one of the multiple spreading profiles, and provide a spread setting 120 corresponding to the selected spreading profiles to the spread spectrum oscillator 200. The spread spectrum oscillator 200 can utilize the base frequency setting 110 and the spread setting 120 to generate the clock signal 130 with a first frequency.

Over time, the spread spectrum selection device 300 can provide additional spread settings in the spreading profile (or from a different spreading profile selected by the spread spectrum selection device 300) to the spread spectrum oscillator 200 for use in varying the frequency of the clock signal 130. For example, the spread spectrum oscillator 200 can utilize the base frequency setting 110 and at least one of the additional spread settings to generate the clock signal 130 with a second frequency. As the spread spectrum selection device 300 provides the spread spectrum oscillator 200 with new spread settings over time, the frequency of the clock signal 130 changes or spreads, which can reduce or eliminate electromagnetic interference with devices proximate to the spread spectrum oscillator 200.

The spread spectrum oscillator 200, the base setting register 102, and the spread spectrum selection device 300 can all be located on a common chip, or system 100 can be distributed over multiple different chips or devices. Although FIG. 1 shows the spread spectrum oscillator 200 varying the frequency of the clock signal 130 based on changes to the spread setting 120 over time, in some embodiments, the spread spectrum oscillator 200 can vary the frequency of the clock signal 130 based on changes to the base frequency setting 110, a combination of changes to both the base frequency setting 110 and the spread setting 120, a different input (not shown), and/or internal programming of the spread spectrum oscillator 200. Embodiments of the spread spectrum oscillator 200 and the spread spectrum selection device 300 will be described below in greater detail.

Figure 2A:
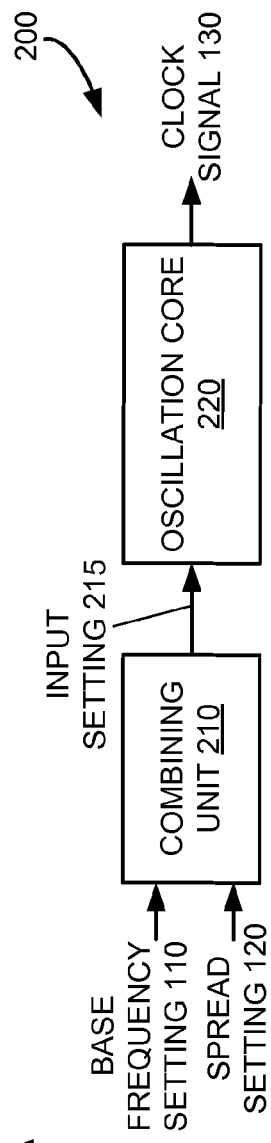
FIGS. 2A-2C are block diagram examples of the spread spectrum oscillator shown in FIG. 1.
Figure 2B:
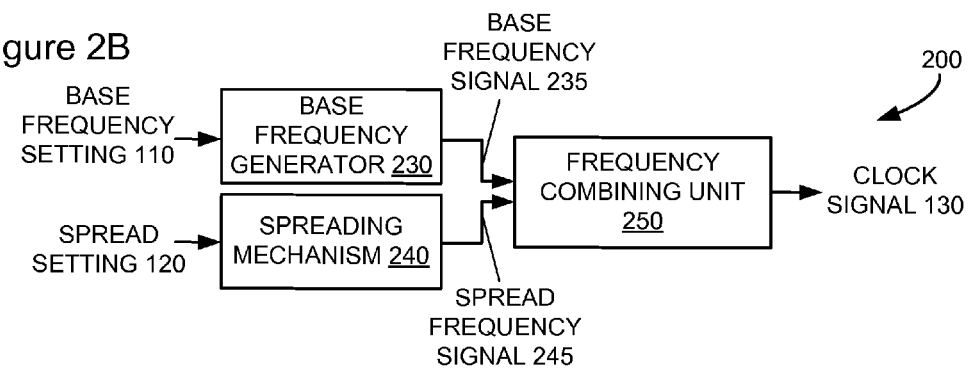
Figure 2C:
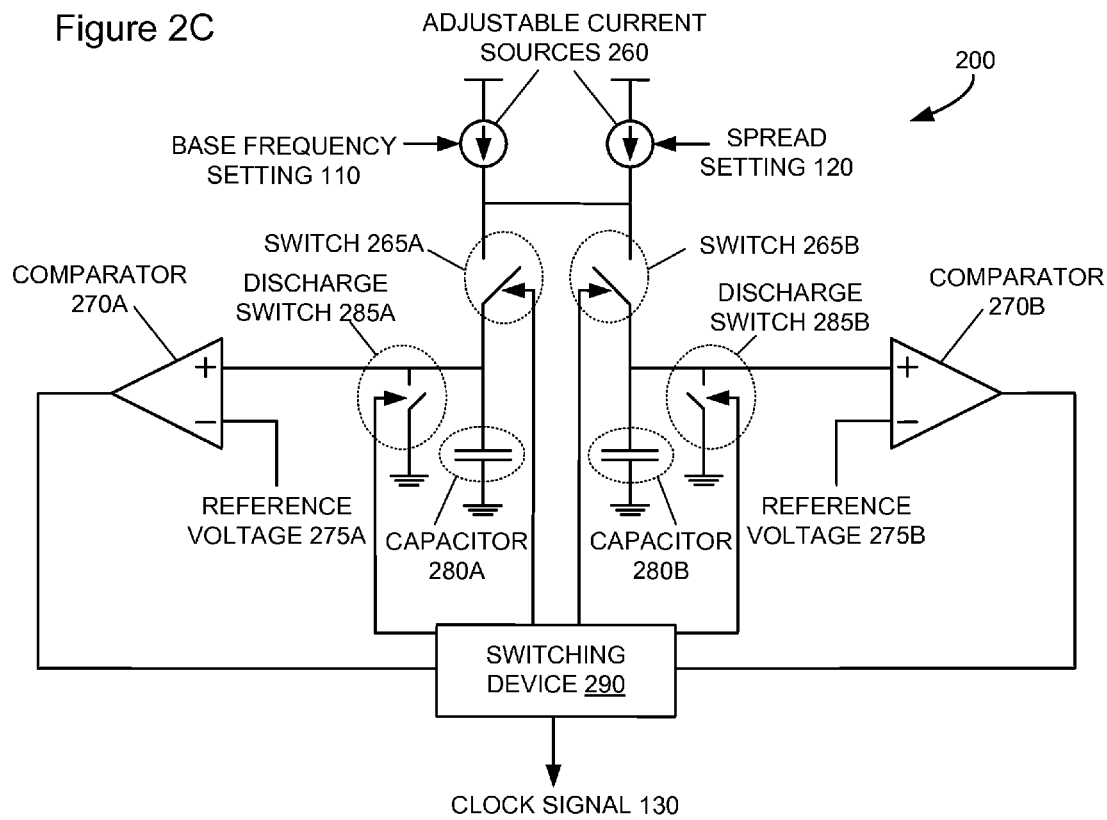

FIGS. 2A-2C are block diagram examples of the spread spectrum oscillator 200 shown in FIG. 1. Referring to FIG. 2A, the spread spectrum oscillator 200 can include a combining unit 210 to receive the base frequency setting 110, for example, from the base setting register 102, and receive the spread setting 120, for example, from the spread spectrum selection device 300. The combining unit 210 can generate an input setting 215, for example, by merging or aggregating the base frequency setting 110 with the spread setting 120. In some embodiments, the base frequency setting 110 can correspond to a particular frequency and the spread setting 120 can indicate an offset or adjustment to the particular frequency.

The spread spectrum oscillator 200 can include an oscillation core 220 to generate the clock signal 130 based on the input setting 215. The input setting 215 can correspond to a specific frequency and the oscillation core 220 can generate the clock signal 130 with the specific frequency in response to the input setting 215. In some embodiments, the oscillation core 220 can be a digitally controlled oscillator and the input setting 215 can be a digital input corresponding to the specific frequency for the clock signal 130.

Referring to FIG. 2B, the spread spectrum oscillator 200 can include a base frequency generator 230 to receive the base frequency setting 110, for example, from the base setting register 102, and generate a base frequency signal 235. In some embodiments, the base frequency generator 230 can include an oscillator to generate a signal having a frequency corresponding to the base frequency indicated by the base frequency setting 110.

The spread spectrum oscillator 200 can include a spreading mechanism 240 to receive the spread setting 120, for example, from the spread spectrum selection device 300, and generate a spread frequency signal 245. In some embodiments, the spreading mechanism 240 can include an oscillator to generate a signal having a frequency corresponding to the spread frequency indicated by the spread setting 120.

The spread spectrum oscillator 200 can include a frequency combining unit 250 to generate the clock signal 130 based on the base frequency signal 235 and the spread frequency signal 245. In some embodiments, the frequency combining unit 250 can combine the base frequency signal 235 with the spread frequency signal 245 to generate the clock signal 130. In other embodiments, the frequency combining unit 250 can adjust the frequency of the base frequency signal 235 based on the spread frequency signal 245 to generate the clock signal 130.

Referring to FIG. 2C, the spread spectrum oscillator 200 is shown in a relaxation oscillator implementation. The spread spectrum oscillator 200 can be an on-chip crystal-less oscillator, for example, which does not receive off-chip timing from a crystal, resonator, and/or a surface acoustical wave (SAW) device. The spread spectrum oscillator 200 can include a pair of adjustable current sources 260 to generate currents with magnitudes corresponding to the base frequency setting 110 and the spread setting 120, respectively. The spread spectrum oscillator 200 can include a switching device 290 to alternate between opening and closing switch 265A and switch 265B, respectively.

For example, the switching device 290 can direct the switch 265A to close and direct the switch 265B to open. The current from the adjustable current sources 260 can flow through closed switch 265A to charge a capacitor 280A. A comparator 270A can compare a voltage corresponding to the charge on the capacitor 280A with a reference voltage 275A, and signal the switching device 290 when the charge on the capacitor 280A meets and/or exceeds the reference voltage 275A.

The switching device 290, in response to the signal from the comparator 270A, can direct the switch 265A to open, direct the switch 265B to close, direct a discharge switch 285A to close, which can discharge the capacitor 280A, direct a discharge switch 285B to open, and prompt a clock transition in the clock signal 130 generated by the switching device 290. The current from the adjustable current sources 260 can flow through closed switch 265B to charge a capacitor 280B. A comparator 270B can compare a voltage corresponding to the charge on the capacitor 280B with a reference voltage 275B, and signal the switching device 290 when the charge on the capacitor 280B meets and/or exceeds the reference voltage 275B.

The switching device 290, in response to the signal from the comparator 270B, can direct the switch 265A to close, direct the switch 265B to open, direct a discharge switch 285B to close, which can discharge the capacitor 280B, direct a discharge switch 285A to open, and prompt a clock transition in the clock signal 130 generated by the switching device 290. The time between the clock transitions by the switching device 290 corresponds to the frequency or period of the clock signal 130.

Since the time between the clock transitions is based on the charging time associated with the capacitors 280A and 280B relative to the reference voltages 275A and 275B, the frequency of the clock signal 130 can be varied with the adjustment of the current supplied in response to the base frequency setting 110 and the spread setting 120. In some embodiments, variations in the reference voltages 275A and 275B, or variations in the capacitance of the capacitors 280A and 280B can also modify the frequency of the clock signal 130.

Although FIG. 2C shows the spread spectrum oscillator 200 as a relaxation oscillator embodiment, in some embodiments, the spread spectrum oscillator 200 can be implemented as a resistor-capacitor (RC) based relaxation oscillator or a ring oscillator. For example, in the RC based relaxation oscillator, an amount of resistance and/or capacitance can be changed or varied in response to the base frequency setting 110 and/or the spread setting 120. In a ring oscillator implementation, a number of stages in the ring oscillator or a bias current to each stage can be varied based on the base frequency setting 110 and/or the spread setting 120, which can vary the delay of a clock signal generated by the ring oscillator.

Figure 3A:
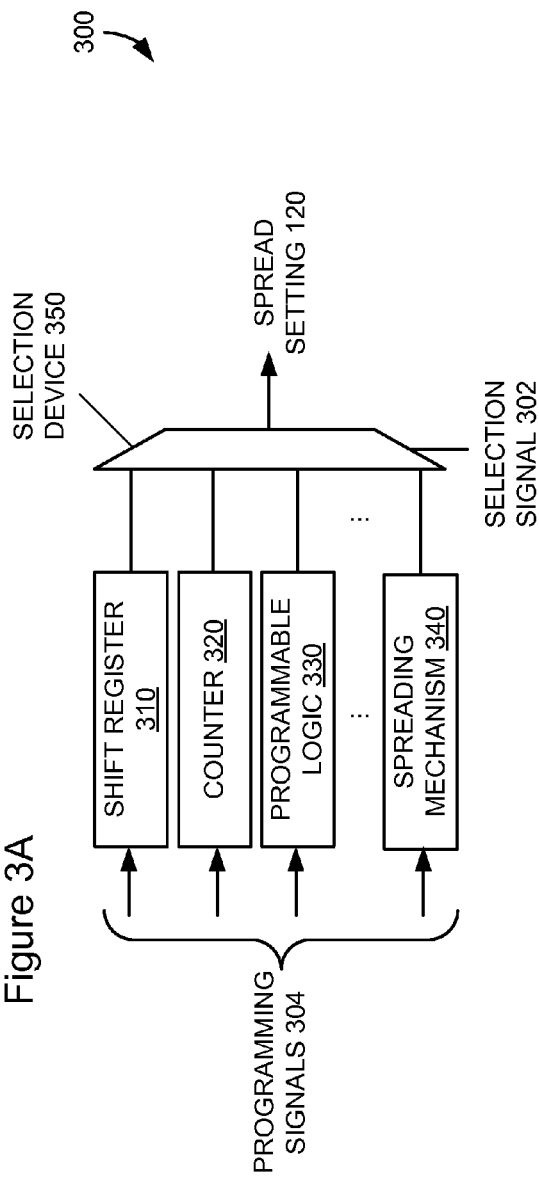
FIG. 3A is a block diagram example of the spread spectrum selection device shown in FIG. 1.

FIG. 3A is a block diagram example of the spread spectrum selection device 300 shown in FIG. 1. Referring to FIG. 3A, the spread spectrum selection device 300 can include multiple spreading devices, such as a shift register 310, a counter 320, a programmable logic 330, and/or a spreading mechanism 340, to output spreading codes to a selection device 350. The selection device 350 can select at least one of the spreading codes from the multiple spreading devices to output as the spread setting 120. In some embodiments, the selection device 350 can select at least one of the spreading codes in response to the selection signal 302. The selection signal 302 can be a preset, user selected, or determined based on system feedback, as will be discussed below in greater detail.

The spreading devices can store or implement any number of spreading codes or spreading profiles. A spreading profile can include a series of spreading codes that the spreading devices can cycle through over time or in response to signaling, such as a clock signal or environmental feedback. In some embodiments, the shift register 310 can be a Linear Feedback Shift Register (LFSR) to generate a pseudo-random sequence of spreading codes to output to the selection device 350. For example, the pseudo-random sequence of spreading codes can prompt generation of frequencies based on an algorithmic function, such as $\sin(x)/x$, where x corresponds to times associated with the selection of the spreading codes.

The counter 320 can be a linear up/down counter that increments or decrements a current spreading code by a preset amount. In some embodiments, the counter 320 can include upper and/or lower threshold levels that, when reached by the current spreading code in the counter 320, can cause the counter 320 to switch between incrementing and decrementing the current spreading code in the counter 320. Such spreading would generate a triangular spread modulation profile such as that shown in FIGS. 3B, 3C, and 3D. In an alternate embodiment, upon reaching a specified or programmable upper or lower threshold the counter may instead be reset or preset to a specific count value and be re-enabled to count again. Such a sequence would provide a sawtooth spread modulation profile.

The programmable logic 330 and the spreading mechanism 340 can allow a user of system 100 to define and implement any number of spreading profiles. In some embodiments, the programmable logic 330 or the spreading mechanism 340 can utilize a look-up table populated with various spreading codes, for example, which can be sequenced based on a clock signal. The programmable logic 330 and the spreading mechanism 340 can be programmed to select a particular sequence of the spreading codes from the look-up table to implement a spreading profile. The timing between selections of the spreading codes in the programmed sequence can also be programmable. The look-up table can be located internally or externally from the programmable logic 330 and/or the spreading mechanism 340.

A spreading profile, such as a series of spreading codes, for example, in the shift register 310, counter 320, programmable logic 330, and/or spreading mechanism 340, can define the number of steps or different spreading codes in the series, a time spent at each step or at each spreading frequency, for example, a modulation rate, and an amplitude or amount of frequency change of the spreading by the series. In some embodiments, the time spent at each step can be constant for each step in the series or varied for one or more steps in the series, which can be preset in the series, and/or dynamically varied in the series. The amplitude of the spreading in the series can indicate a change in amplitude for each step in the series or an overall change in amplitude caused by the series. For example, a series can cause a frequency change for clock signal 130 to be a certain percentage of a base oscillator frequency.

Figure 3B:
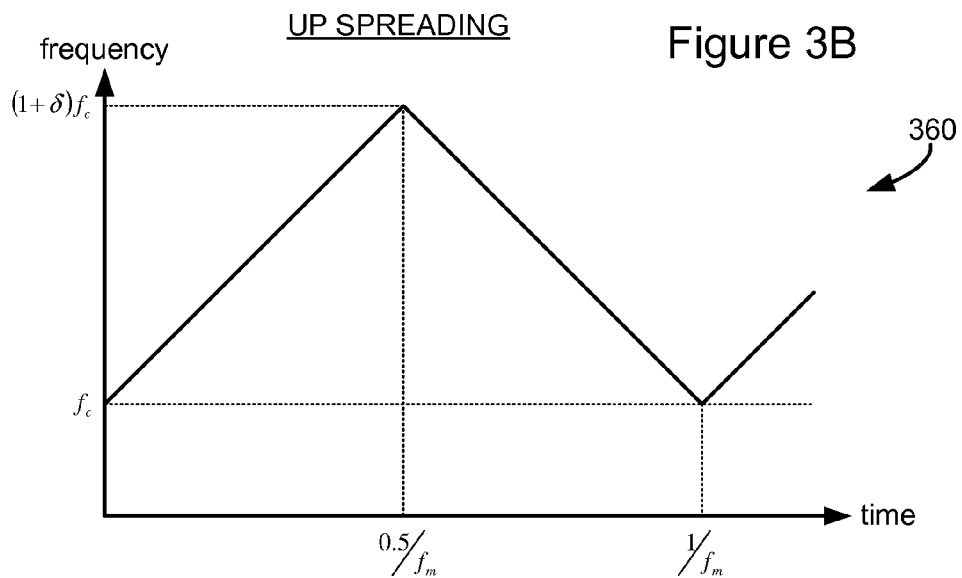
FIGS. 3B-3E are examples of frequency spreading based on various spreading profiles.

FIGS. 3B-3E are examples of clock signal frequency spreading based on various spreading profiles. Referring to FIG. 3B, a frequency spreading graph 360 shows an implementation of a spreading profile that results in an up spreading embodiment. In the up spreading embodiment, the frequency of a clock signal can range between a reference frequency $f_c$ and frequency threshold $(1+\delta)f_c$, where $\delta$ is an offset value. In some examples, the clock signal frequency can initially be set to the reference frequency $f_c$ and increase to the frequency threshold $(1+\delta)f_c$, and then decrease back to the reference frequency $f_c$. The period $1/f_m$ of the up spreading embodiment can be the time for the clock signal frequency to spread from the reference frequency $f_c$ to the frequency threshold $(1+\delta)f_c$, and back to the reference frequency $f_c$. In some embodiments, the reference frequency $f_c$, the offset value $\delta$, and/or the period $1/f_m$ of the spreading profile can be programmably varied in order to alter the up spreading embodiment.

Figure 3C:
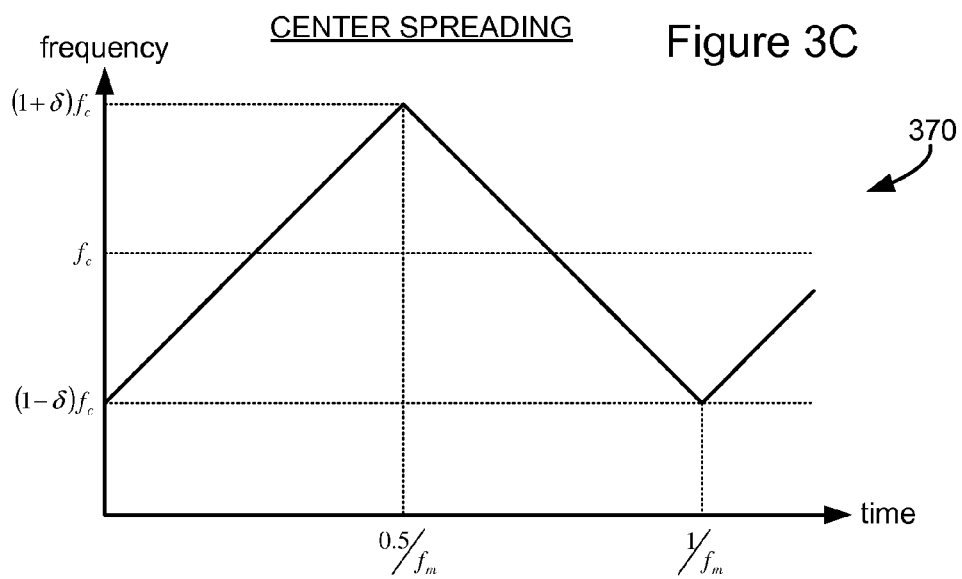

Referring to FIG. 3C, a frequency spreading graph 370 shows a frequency center spreading embodiment. Referring to FIG. 3C, a frequency spreading graph 370 shows an implementation of a spreading profile that results in a center spreading embodiment. The center spreading embodiment is similar to the up spreading embodiment except for the spreading is between a lower threshold $(1-\delta)f_c$ and an upper threshold $(1+\delta)f_c$ centered around the reference frequency $f_c$. In some embodiments, the reference frequency $f_c$, the offset value $\delta$, and/or the period $1/f_m$ of the spreading profile can be programmably varied in order to alter the center spreading embodiment.

Figure 3D:
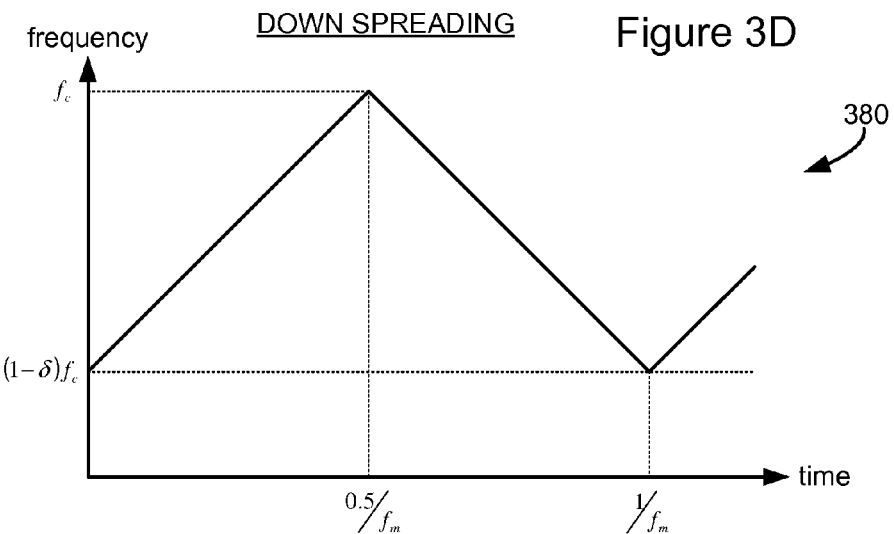

Referring to FIG. 3D, a frequency spreading graph 380 shows a frequency down spreading embodiment. Referring to FIG. 3D, a frequency spreading graph 380 shows an implementation of a spreading profile that results in a down spreading embodiment. The down spreading embodiment is similar to the up spreading embodiment except for the spreading is between a lower threshold $(1-\delta)f_c$ and the reference frequency $f_c$. In some embodiments, the reference frequency $f_c$, the offset value $\delta$, and/or the period $1/f_m$ of the spreading profile can be programmably varied in order to alter the down spreading embodiment. Although FIGS. 3B-3D shows linear progressions over time, in some embodiments, the clock signal can alter frequencies in non-uniform steps and/or with non-periodic durations between those steps.

Figure 3E:
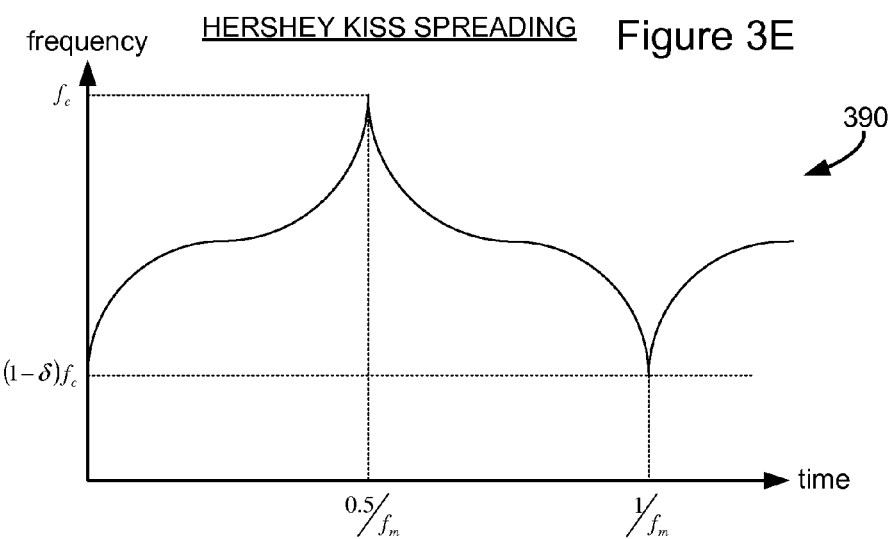

Referring to FIG. 3E, a frequency spreading graph 390 shows a Hershey kiss down spreading embodiment. Referring to FIG. 3C, a frequency spreading graph 390 shows an implementation of a spreading profile that results in a Hershey kiss down spreading embodiment. The Hershey kiss down spreading embodiment is similar to the down spreading embodiment except for the spreading is between the lower threshold $(1-\delta)f_c$ and the reference frequency $f_c$ is not linear. Instead, the frequency spreading over time is non-linear, such as exponential or parabolic, to form a representation of a Hershey kiss on frequency spreading graph 390. In some embodiments, the spreading profile that implements the Hershey kiss embodiment can utilize a look-up table populated with spread settings that, when used to generate the clock signal over time, can spread the frequency of the clock signal according to the frequency spreading graph 390. In some embodiments, the reference frequency $f_c$, the offset value $\delta$, and/or the period $1/f_m$ of the spreading profile can be programmably varied in order to alter the Hershey kiss spreading embodiment.

Referring back to FIG. 3A, in some embodiments, a processing system can program the shift register 310, counter 320, programmable logic 330, and/or spreading mechanism 340 with spreading profiles, for example, through programming signals 304. For example, the shift register 310 can be programmed to include a spreading profile with a series of spread settings having a variable sequence length, the steps of which are cycled through in response to a variable update clock rate. The variable update clock rate can be programmed via programming signals 304. The shift register 310 also can scale the individual spreading codes in the series to cause a corresponding magnitude change in the frequency of the clock signal. In some examples, the spreading codes can vary from 1-to-10 for a smaller amplitude scaling, or 1-to-50 for a larger frequency impact. The shift register 310 can achieve the amplitude scaling of the spreading codes, for example, by shifting or masking bits of the spreading codes. In some examples, the spreading devices can allow the spread spectrum oscillator 200 to perform the amplitude scaling.

Figure 4:
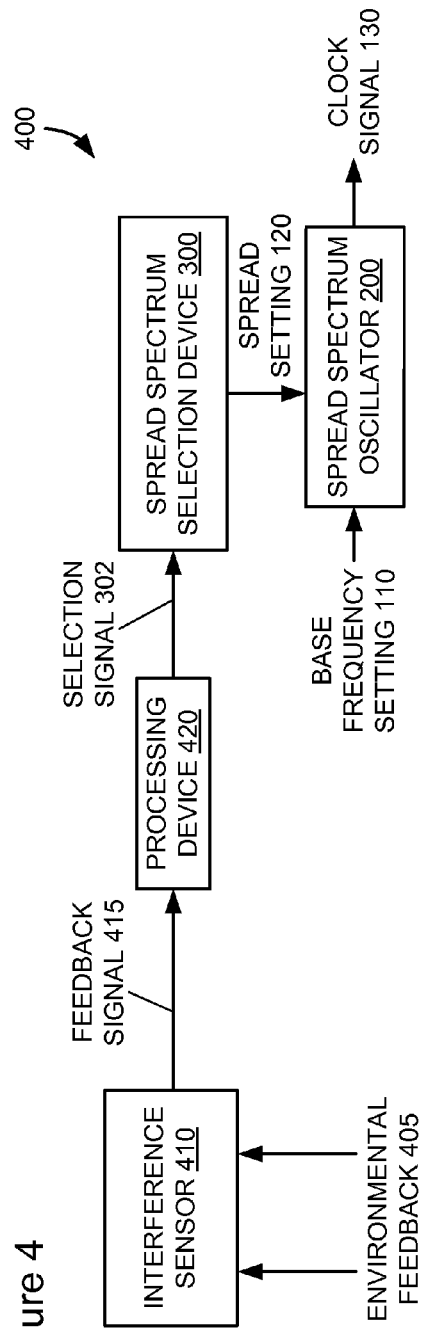
FIG. 4 is a block diagram example of a system including an environmental feedback path for a spread spectrum oscillator.

FIG. 4 is a block diagram example of a system 400 including an environmental feedback path for a spread spectrum oscillator 200. Referring to FIG. 4, the spread spectrum oscillator 200 can generate the clock signal 130 based on the base frequency setting 110 and the spread setting 120 from a selected spreading profile. The generation of the clock signal 130 may cause electromagnetic interference with surrounding devices operating at a frequency of the clock signal or one or it harmonics.

System 400 can include an interference sensor 410 to receive environmental feedback 405, for example, corresponding to any electromagnetic interference associated with the system 400. In some embodiments, the environmental feedback 405 can be signals from devices surrounding the spread spectrum oscillator 200 identifying the presence of electromagnetic interference, or the signals can be utilized by the interference sensor 410 to detect the presence of electromagnetic interference in the devices surrounding the spread spectrum oscillator 200. The interference sensor 410 can directly detect electromagnetic interference from the environmental feedback 405. In some embodiments, the environmental feedback 405 can identify any incoming electromagnetic interference to the system 400 or be signaling to the system 400 corresponding to the operation or performance of the system 400, for example, that can be utilized by the interference sensor 410 to detect incoming electromagnetic interference and the effects on the performance of the system 400.

The interference sensor 410 can generate a feedback signal 415 indicating the presence of electromagnetic interference in system 400 or its surrounding environment and provide the feedback signal 415 to a processing device 420. The processing device 420 can generate a selection signal 302 in response to the feedback signal 415. The spread spectrum selection device 300 can select a spreading profile in response to the selection signal 302 and the spread spectrum oscillator 200 can generate the clock signal 130 with a different frequency and spreading based on the base frequency setting 110 and the spread setting 120 corresponding to the selected spreading profile. In some embodiments, the spread spectrum selection device 300 can select a different spreading profile that includes a set of one or more of the spread settings in response to the selection signal 302. The spreading profiles can include spread settings that, when utilized by the spread spectrum oscillator 200, can generate a clock signal 130 having different spreading over time, such as a varied amplitude, a different number of steps, and/or a different time duration between the steps. In some embodiments, the processing device 420 can generate one or more new spreading profiles or modify one or more existing spreading profiles in the spread spectrum selection device 300 in response to the feedback signal 415.

In some embodiments, the processing device 420 can ascertain a frequency or frequencies of the clock signal generation that cause the electromagnetic interference and determine a different spreading profile or individual spread settings 120 that may be able to reduce or eliminate the electromagnetic interference. The selection signal 302 can identify the different spreading profile or those individual spread settings 120 in spread spectrum selection device 300 for the spread spectrum oscillator 200 to utilize in generating the clock signal 130.

The processing device 420 also can generate programming signals 304 to program at least one of the shift register 310, the counter 320, the programmable logic 330, and/or the spreading mechanism 340 with a spreading profile or spread setting 120 that may be able to reduce or eliminate the electromagnetic interference. In some embodiments, the interference sensor 410 can provide the feedback signal 415 directly to the spread spectrum selection device 300 as the selection signal 302. The processing device 420 can program the spread spectrum device 300 to the adjust the spreading amplitude and/or spreading profile of the clock signal 130 until the feedback signal 415 indicates any interference from the emissions by the spread spectrum oscillator 200 are within a predetermined range. In some embodiments, the processing device 420 can program the spread spectrum selection device 300 to direct the spread spectrum oscillator 200 to reduce or stop spreading the frequency of the clock signal 130 in response to a determination by the processing device 420 that any interference from the emissions by the spread spectrum oscillator 200 is within the predetermined range.

Figure 5:
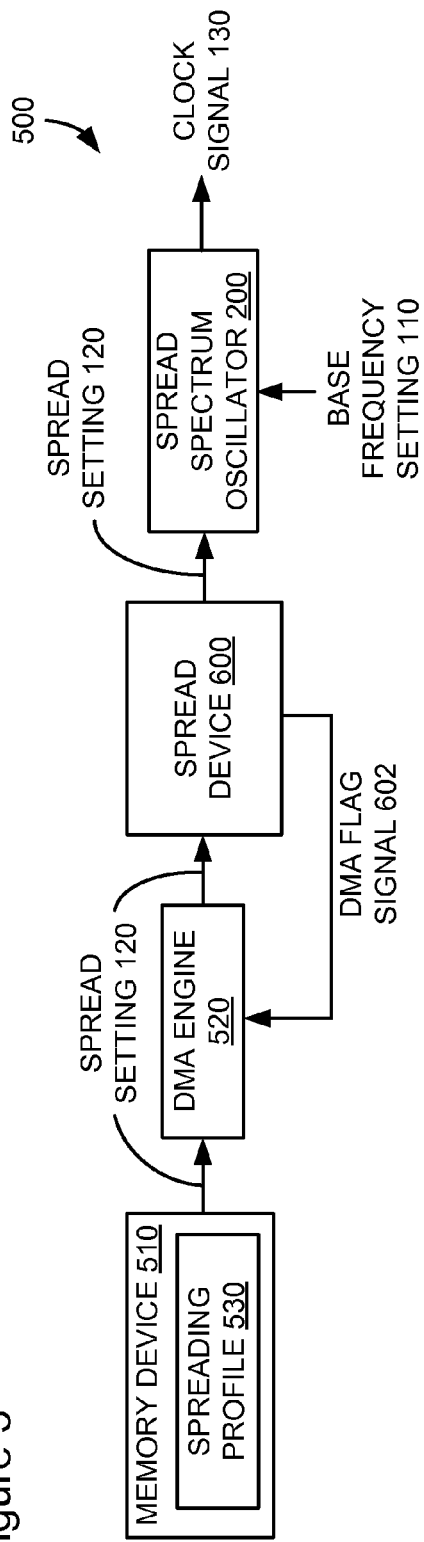
FIG. 5 is a block diagram example of a system including a direct memory access path for a spread spectrum oscillator.

FIG. 5 is a block diagram example of a system 500 including a direct memory access path for a spread spectrum oscillator 200. Referring to FIG. 5, the system 500 can include a direct memory access (DMA) engine 520 to directly access a spreading profile 530 in a memory device 510 and to provide the spread setting 120 from the spreading profile 530 to a spread device 600. The spread device 600 can transfer the spread setting 120 to the spread spectrum oscillator 200, which can generate the clock signal 130 based on the base frequency setting 110 and the spread setting 120. In some embodiments, the spread device 600 can provide a DMA flag signal 602 to the DMA engine 520, which can indicate that the spread device 600 can receive another spread setting in the spreading profile 530 from the memory device 510. The spread device 600 can provide a DMA flag signal 602 after a period of time has elapsed, in response to an output of a spread setting 120 to the spread spectrum oscillator 200, or when less than a threshold number of spread settings remain in the spread device 600.

Figure 6:
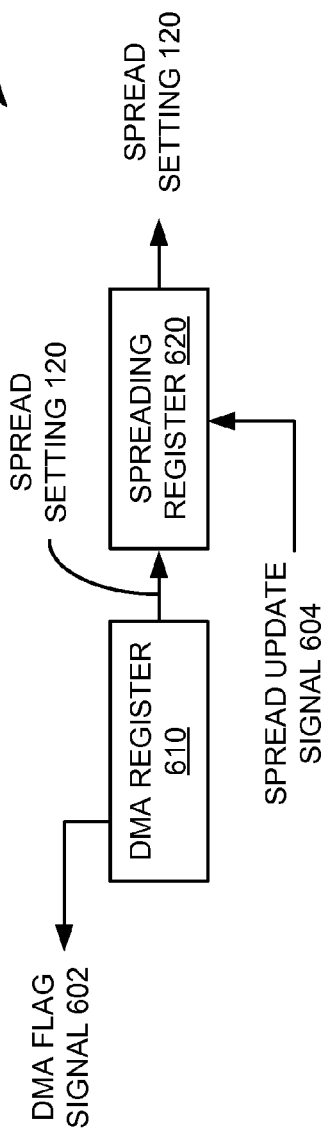
FIG. 6 is a block diagram example of the spread spectrum selection device shown in FIG. 5.

FIG. 6 is a block diagram example of the spread device 600 shown in FIG. 5. Referring to FIG. 6, the spread device 600 can include a DMA register 610 to store the spread setting 120 received from memory device 510 by DMA engine 520. The DMA register 610 can provide the spread setting 120 to a spreading register 620. The spreading register 620 can output the spread setting 120, for example, to the spread spectrum oscillator 200, in response to a spread update signal 604. The spread update signal 604 can be a periodic signal, such as a clock signal, an asynchronous signal, or a user selected timing signal.

Since the DMA engine 520 can perform direct memory access operations in an asynchronous manner, for example, due to a main system processing device utilizing routing and memory resources, such as memory device 510, the DMA register 610 can allow the DMA engine 520 the ability to access memory device 510 relatively independently of the spread update signal 604. Thus, the timing of the spread device 600 providing the spread setting 120 to the spread spectrum oscillator 200 can be directed by the spread update signal 604 without delay that may be caused by an availability of the memory device 510 to the DMA engine 520.

The DMA register 610 can issue a DMA flag signal 602 to the DMA engine 520, which can alert the DMA engine 520 that another spread setting in the spreading profile 530 may be retrieved by the DMA engine 520 from the memory device 510. In some embodiments, the DMA register 610 can issue the DMA flag signal 602 in advance of a spread setting change event prompted by the spread update signal 604 in the spreading register 620.

Figure 7:
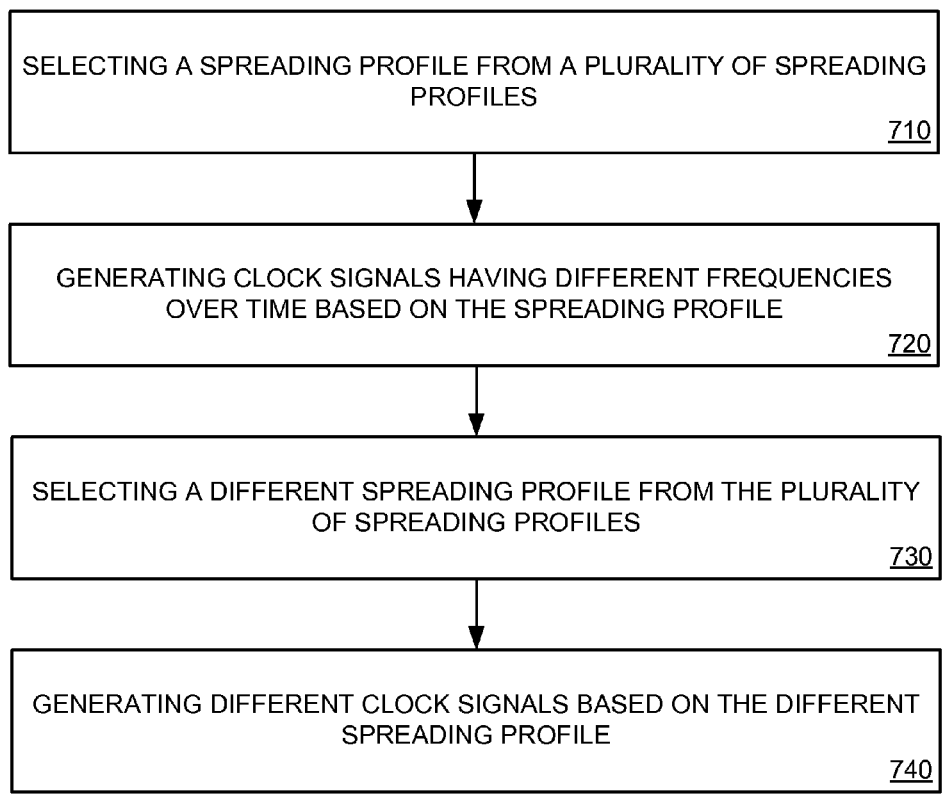
FIG. 7 is an example operational flowchart for the operation of a spread spectrum oscillator.

FIG. 7 is an example operational flowchart for the operation of a spread spectrum oscillator. Referring to FIG. 7, in a block 710, a spreading profile can be selected from a plurality of spreading profiles. The spreading profile can include multiple spread settings, which can be configured to identify an offset corresponding to a frequency associated with the base frequency setting. The spreading profile can define a number of spread settings, a spreading frequency associated with the spread settings, and an amplitude of clock frequency spreading. The spreading profile can be selected from at least one of a shift register, a linear counter, or programmable logic, each configured to store or implement at least one of the plurality of spreading profiles.

In a next block 720, clock signals having different frequencies can be generated over time based on the spreading profile. The clock signals can be generated based on a base frequency setting and the multiple spread settings.

In a next block 730, a different spreading profile can be selected from the plurality of spreading profiles. The different spreading profile can be selected in response to electromagnetic interference associated with the clock signals generated based on the spreading profile, for example, selected in block 710. In some embodiments, the electromagnetic interference can be detected by an interference sensor, for example, based on environmental feedback. In some embodiments, a new spreading profile for inclusion in the plurality of spreading profiles can be generated in response to the electromagnetic interference.

In a next block 740, different clock signals can be generated based on the different spreading profile. The different clock signals can be generated based on a base frequency setting and multiple spread settings in the different spreading profile. Although FIG. 7 shows blocks 710-740 performing operations one order, the order of execution of the block 710-740 can be varied.

The system and apparatus described above may use dedicated processor systems, micro controllers, programmable logic devices, microprocessors, or any combination thereof, to perform some or all of the operations described herein. Some of the operations described above may be implemented in software and other operations may be implemented in hardware. Any of the operations, processes, and/or methods described herein may be performed by an apparatus, a device, and/or a system substantially similar to those as described herein and with reference to the illustrated figures.

The processing device may execute instructions or "code" stored in memory. The memory may store data as well. The processing device may include, but may not be limited to, an analog processor, a digital processor, a microprocessor, a multi-core processor, a processor array, a network processor, or the like. The processing device may be part of an integrated control system or system manager, or may be provided as a portable electronic device configured to interface with a networked system either locally or remotely via wireless transmission.

The processor memory may be integrated together with the processing device, for example RAM or FLASH memory disposed within an integrated circuit microprocessor or the like. In other examples, the memory may comprise an independent device, such as an external disk drive, a storage array, a portable FLASH key fob, or the like. The memory and processing device may be operatively coupled together, or in communication with each other, for example by an I/O port, a network connection, or the like, and the processing device may read a file stored on the memory. Associated memory may be "read only" by design (ROM) by virtue of permission settings, or not. Other examples of memory may include, but may not be limited to, WORM, EPROM, EEPROM, FLASH, or the like, which may be implemented in solid state semiconductor devices. Other memories may comprise moving parts, such as a known rotating disk drive. All such memories may be "machine-readable" and may be readable by a processing device.

Operating instructions or commands may be implemented or embodied in tangible forms of stored computer software (also known as "computer program" or "code"). Programs, or code, may be stored in a digital memory and may be read by the processing device. "Computer-readable storage medium" (or alternatively, "machine-readable storage medium") may include all of the foregoing types of memory, as well as new technologies of the future, as long as the memory may be capable of storing digital information in the nature of a computer program or other data, at least temporarily, and as long at the stored information may be "read" by an appropriate processing device. The term "computer-readable" may not be limited to the historical usage of "computer" to imply a complete mainframe, mini-computer, desktop or even laptop computer. Rather, "computer-readable" may comprise storage medium that may be readable by a processor, a processing device, or any computing system. Such media may be any available media that may be locally and/or remotely accessible by a computer or a processor, and may include volatile and non-volatile media, and removable and non-removable media, or any combination thereof.

A program stored in a computer-readable storage medium may comprise a computer program product. For example, a storage medium may be used as a convenient means to store or transport a computer program. For the sake of convenience, the operations may be described as various interconnected or coupled functional blocks or diagrams. However, there may be cases where these functional blocks or diagrams may be equivalently aggregated into a single logic device, program or operation with unclear boundaries.

One of skill in the art will recognize that the concepts taught herein can be tailored to a particular application in many other ways. In particular, those skilled in the art will recognize that the illustrated examples are but one of many alternative implementations that will become apparent upon reading this disclosure.

Although the specification may refer to "an", "one", "another", or "some" example(s) in several locations, this does not necessarily mean that each such reference is to the same example(s), or that the feature only applies to a single example.

What is claimed is:

1. An apparatus comprising:
    a spread spectrum selection device comprising:
        a plurality of different spreading devices, wherein each of the plurality of different spreading devices is configured to store a spreading profile for clock signals; and
        a selection device coupled to the plurality of different spreading devices, the selection device to select the spreading profile of a first spreading device from the plurality of spreading devices, wherein the selected spreading profile comprises a plurality of spread settings for the clock signals, and wherein the selection device is to output the plurality of spread settings of the selected spreading profile from the first spreading device; and
    an oscillation device coupled to the spread spectrum selection device, the oscillation device to receive plurality of spread settings from the selection device and to generate the clock signals having different frequencies over time based on the selected spreading profile.

2. The apparatus of claim 1, wherein the oscillation device is configured to generate the clock signals based on a base frequency setting and the plurality of spread settings of the selected spreading profile.

3. The apparatus of claim 2, wherein the plurality of spread settings are configured to identify an offset corresponding to a frequency associated with the base frequency setting.

4. The apparatus of claim 1, further comprising:
    a processing device to program at least one of the plurality of different spreading devices, wherein the plurality of different spreading devices comprises at least one of a shift register, a linear counter, or a programmable logic with a plurality of spreading profiles.

5. The apparatus of claim 1 further comprising an interference sensor to identify environmental signals associated with electromagnetic interference, wherein the selection device is configured to select a different spreading profile from the plurality of different spreading devices in response to the environmental signals, wherein the different spreading profile comprises a different plurality of spread settings, and wherein the oscillation device is configured to receive the different plurality of spread settings of the different spreading profile and to generate clock signals based on the different spreading profile.

6. The apparatus of claim 1, wherein the spread spectrum selection device and the oscillation device are located on a single integrated circuit.

7. The apparatus of claim 1,
wherein the spread spectrum selection device is to cycle through the plurality of spread settings of the spreading profile and output the plurality of spread settings to the oscillation device.

8. The apparatus of claim 1, wherein the selection device is to select the spreading profile responsive to a selection signal received from a processor and output the plurality of spread settings to the oscillation device.

9. A method comprising:
configuring each of a plurality of different spreading devices of a spread spectrum selection device with a spreading profile for clock signals;
selecting, by a selection device, the spreading profile of a first spreading device from the plurality of spreading devices, wherein the selected spreading profile comprises a plurality of spread settings for the clock signals, and wherein the selection device is to output the plurality of spread settings of the selected spreading profile from the first spreading device; and
outputting the plurality of spread settings of the selected spreading profile from the selection device; and
generating, by an oscillation device, the clock signals having different frequencies over time based on the selected spreading profile.

10. The method of claim 9, wherein generating the clock signals further comprises generating the clock signals based on a base frequency setting and the plurality of spread settings of the selected spreading profile.

11. The method of claim 10, wherein the plurality of spread settings are configured to identify an offset corresponding to a frequency associated with the base frequency setting.

12. The method of claim 9 further comprising:
detecting environmental signals associated with electromagnetic interference;
determining a different spreading profile from the plurality of different spreading devices in response to the environmental signals, wherein the different spreading profile comprises a different plurality of spread settings;
receiving at the oscillation device the different plurality of spread settings of the different spreading profile; and
generating clock signals based on the different spreading profile.

13. The method of claim 12 further comprising generating a new spreading profile in response to the electromagnetic interference.

14. The method of claim 9, wherein outputting the plurality of spread settings comprises cycling through the plurality of spread settings to output the plurality of spread settings to the oscillation device.

15. The method of claim 14, wherein the cycling through the plurality of spread settings is performed responsive to signaling.

16. An apparatus comprising:
a spread spectrum selection device comprising:
a plurality of different spreading devices, wherein each spreading device of the plurality of different spreading devices is configured to store a spreading profile for clock signals; and
a selection device coupled to the plurality of different spreading devices, the selection device to select the spreading profile of a first spreading device of the plurality of spreading devices, wherein the selected spreading profile comprises a plurality of spread settings for the clock signals, and wherein the selection device is to output the plurality of spread settings of the selected spreading profile from the first spreading device; and
an oscillation device coupled to the spread spectrum selection device, the oscillation device to receive the plurality of spread settings from the selection device and to generate the clock signals having different frequencies over time based on a base frequency setting and multiple offsets in the selected spreading profile.

17. The apparatus of claim 16 further comprising a combining unit to sequentially combine the base frequency setting with the offsets, wherein the oscillation device is configured to generate the clock signals based on the combinations of the base frequency setting and the offsets.

18. The apparatus of claim 17, wherein the oscillation device includes the combining unit.

19. The apparatus of claim 16, wherein the oscillation device comprises:
a base frequency device to generate a first signal having a frequency corresponding to the base frequency setting;
a spread frequency device to generate a second signal having a frequency corresponding to the offset; and
a combining unit to combine the first signal and the second signal to generate at least one of the clock signals.

20. The apparatus of claim 16, wherein spread spectrum selection device and the oscillation device are located on an integrated circuit.

* * * * *